(12) United States Patent
Ghis et al.

(10) Patent No.: US 6,680,606 B1
(45) Date of Patent: Jan. 20, 2004

(54) ELECTRICAL SAMPLER FOR NON-SIMULTANEOUS SAMPLING

(75) Inventors: Anne Ghis, St Martin d'Héres (FR); Sami Ajram, Bouc-Bel-Air (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 09/701,840

(22) PCT Filed: Jun. 4, 1999

(86) PCT No.: PCT/FR99/01319

§ 371 (c)(1),
(2), (4) Date: Jan. 22, 2001

(87) PCT Pub. No.: WO99/64873

PCT Pub. Date: Dec. 16, 1999

(30) Foreign Application Priority Data

Jun. 5, 1998 (FR) .............................................. 98 07087

(51) Int. Cl.[7] .............................................. G01R 13/14
(52) U.S. Cl. ...................... 324/76.15; 324/76; 324/35
(58) Field of Search .................... 324/76.15, 76.24, 324/96, 753, 76.35, 532; 327/91, 94; 702/66

(56) References Cited

U.S. PATENT DOCUMENTS

| 3,925,727 | A | | 12/1975 | Duguay | .................. 324/121 R |
|---|---|---|---|---|---|
| 5,457,637 | A | * | 10/1995 | Seitchik et al. | ................ 702/66 |
| 5,471,162 | A | * | 11/1995 | McEwan | ...................... 327/92 |
| 5,740,064 | A | * | 4/1998 | Witte et al. | .................... 702/70 |
| 6,060,915 | A | * | 5/2000 | McEwan | ...................... 327/94 |
| 6,246,044 | B1 | * | 6/2001 | Ghis | .......................... 250/214 |
| 6,320,367 | B1 | * | 11/2001 | Cuzin et al. | ................... 324/96 |
| 6,384,758 | B1 | * | 5/2002 | Michalski et al. | .......... 341/122 |

FOREIGN PATENT DOCUMENTS

| DE | 2047738 | 3/1972 |
|---|---|---|
| EP | 0086305 | 8/1983 |
| FR | 2764070 | 12/1998 |
| WO | WO8302829 | 8/1983 |
| WO | WO9313427 | 7/1993 |
| WO | WO9406121 | 3/1994 |

* cited by examiner

Primary Examiner—N. Le
Assistant Examiner—Walter Benson
(74) Attorney, Agent, or Firm—Thelen Reid & Priest LLP

(57) ABSTRACT

An electrical sampler device has a plurality of samplers for sampling an electrical signal. Each of the samplers is responsive to a corresponding sampling point. The electrical sampler device also has a propagation line coupled to each of the plurality of samplers, for propagating a sampling signal. One or more delay elements are coupled to the propagation line. The delay means elements delay the propagation of the sampling signal between two neighboring samplers.

12 Claims, 4 Drawing Sheets

ELECTRICAL SAMPLER FOR NON-SIMULTANEOUS SAMPLING

This application is a national phase of PCT/FR99/01319 which was filed on Jun. 4, 1999 and was not published in English.

TECHNOLOGICAL FIELD

The invention relates to the field of electrical sampling, particularly of pulses of short or very short duration.

The metrology of pulses enables one to describe the evolution in time of a signal, or an electrical pulse, in particular its voltage or its energy, when this signal, or this pulse, is, for example, unique (i.e. non-repetitive), and very brief (that is to say, has a duration of the order of a few tens or a few hundreds of picoseconds).

Such pulses to be measured generally arise from very fast radiation detectors, which convert into electrical pulses, the energy of a pulse of radiation that they receive, for example, a pulse of X, or gamma, or visible, or infra-red radiation. Such radiation can be emitted by ultra-fast radiation sources, such as lasers or sources of synchrotron radiation, or can be the result of a laser-material interaction caused by an ultra-fast laser (that is to say, the duration of the pulse is in the picosecond or femtosecond range).

The invention can be applied to any measurement of a very brief electrical signal, particularly a non-repetitive signal, in particular in the physics of events, or in the measurement of events, generated by picosecond phenomena.

STATE OF THE TECHNOLOGY

There currently exist on the market sampling oscilloscopes for the measurement of signals whose spectrum extends to 50 GHz or 70 GHz. These pieces of equipment enable one to measure repetitive pulses. The sampling frequency is variable between from 250 kHz to 1 GHz.

In order to measure single pulses, commercial equipment exists on the market: this equipment enables one to reconstruct a spectrum up to 5 GHz or 7 GHz.

Among the laboratory prototypes, a known device is that described in document U.S. Pat. No. 5,471,162. Such a device rests on the principle of spatial sampling of a pulse. A pulse propagates along its line of propagation. The result is a spatial equivalent of the evolution, over time, of this pulse which is propagated on the line with a speed depending on its physical characteristics. At a specified instant t, if the line is of sufficient length, the whole of the pulse is distributed spatially along the line.

If the samplers are arranged along the line of propagation, their simultaneous actuation allows one to carry out complete sampling of the pulse, with a time step equal to the spatial step of the samplers, divided by the speed of propagation.

An optical sampling device is also known which measures signals with a bandwidth up to 35 GHz. This device is illustrated in FIG. 1. It comprises a line of propagation 2 into which a pulse signal 4 to be measured is inserted and along which it propagates. Along the line of propagation sampling ports 6, made of a photo-conductive material (CdTe), are arranged in a regular manner. These sampling ports are associated with sampling lines 8, each of which is connected to charge reading means. The set of charge reading means is gathered into a charge reading device 10. These charge reading means are connected to a computer 12 programmed to measure the relative charges on each channel and to analyze the pulse 4. Each sampling port 6 has its circuit closed by a triggering light pulse 14: a triggering light pulse is necessary which is distributed over all the sampling ports. Therefore, this device requires a picosecond optical flash of a few tens of nanojoules to trigger the sampling.

These known samplers are therefore photo-conductors, in the case of the optical sampler (FIG. 1) and diodes in the case of the compact digitizer.

In these known structures, samplers sample a part of the signal present at their position on the line. They are placed in parallel, on this line of propagation.

Document FR-97 06534 describes a single action electrical sampler for short pulses.

The principle of this electrical sampler, with line sections is illustrated in FIG. 2.

A structure, or line, 24 of propagation of electrical pulses comprises a plurality of sections 18, 20, 22 of this structure. The different sections are linked, two by two, through switches 28, 29, constituted by, for example, MESFET AsGa (or Si, or MOS transistors or bipolar transistors on Si).

The command means for the switches 28, 29 comprise, for example, a second structure 26 for the propagation of a triggering pulse, to which the switches 28 are connected.

In FIG. 2, only three sections of the line 24 have been shown, but the line may comprise any number of sections, separated, two by two, and connected two by two, by the switches.

A signal to be sampled propagates along the propagation structure, or the line of propagation 24.

Along the line of propagation 26, a synchronization signal is propagated, for example a voltage step slot. The switches are normally on, or closed, and the voltage step opens these switches. This step or slot, therefore isolates each section of the line of propagation, which is then used as a storage capacitance.

The whole of the charges transported by the pulse is then confined in the different sections 18, 20, 22 that make up the pulse propagation structure.

The structure illustrated in FIG. 2 thus comprises:
  on the one hand, a first propagation structure 24 where the quantity of charges to be measured is propagated and which is made up of sections connected two by two by switches which are initially closed,
  on the other hand, a second propagation structure in which a synchronization signal of the "step" type can be propagated; at the moment the step passes, this modifies the command of the state of the switch in such a way that it opens and isolates the two sections to which it is connected, charges then being trapped in a section when the two switches which mark its limits are open. It is these charges which are subsequently read by a suitable reading device.

The device is completed by means of generating a synchronization signal, these means being connected to the structure 26 for propagating synchronization pulses. In addition, they can be connected to a device for reading the charges in the sections.

These samplers have a restricted bandwidth, linked to the bandwidth of the line itself. Furthermore the sensitivity of detection (that is to say the quantity of charges sampled in the signal) is also limited. With regard to the optical sampler, the use of a picosecond, high power laser imposes very great financial and experimental constraints.

Finally, all these devices require a very long propagation line, corrupting the signal in a non-uniform manner.

DESCRIPTION OF THE INVENTION

The invention relates to a novel electrical sampler. In particular, it relates to an analyzer of fugitive signals, that uses a non-simultaneous spatial sampling method.

It also relates to an analyzer of fugitive signals, that uses a new technology for coupling substrates.

Such an analyzer can be used for laser diagnostics. Its field of application also extends to the measurement of rapid single signals of any origin, through a simple adaptation.

More precisely, the subject of the invention is an electrical sampler, characterized in that it comprises:

a structure for the propagation of electrical pulses,

N means of sampling connected, on the one hand, to sampling points along the propagation structure, and, on the other hand, to means for the propagation of sampling signals, means to temporally delay the propagation of a sampling signal between two consecutive sampling means.

A spatial sampling device according to the invention uses as many elementary samplers as there are samples to be taken. Each elementary sampler only functions once by acquisition. The signal is propagated on a propagation support matched to the frequencies to be analyzed, along which the samplers are arranged sequentially in such a way that the signal passes in front of each of them with a time shift that is linked to the spatial step of the layout of the samplers and to the temporal delay means of the sampling signal.

The acquisition or sampling signal is transmitted from sampler to sampler. The combination of the delay time between two samples and the propagation time of the signal on the line determines the sampling step of the device. Hence non-simultaneous spatial sampling is being carried out. This means that a very long propagation line which corrupts the signal in a non-uniform way is not necessary.

The length of this line is greater than or equal to the sum of the spaces taken up by the switches. One switch, together with its connections occupies, for example, a space of 50 $\mu m$.

Therefore the invention enables a line that is smaller than those of the prior art to be used. The line can be smaller than the space occupied by the pulse to be measured.

Means may be provided, on the propagation line, for sampling orders, in order to vary the delay between two successive samplers.

According to this embodiment, it is therefore possible to vary the sampling time step, by varying the delay between two successive samplers. This delay can be chosen by the user according to the sampling frequency and the analysis window for which it is needed.

According to another aspect of the invention, an electrical sampler comprises a structure for propagation of electrical pulses, created on a first substrate. Voltage pulses are sampled on this propagation structure using sampling and tapping means created on a second substrate. In addition, these means are connected to means of storing or storing and reading the charges corresponding to the pulses sampled.

BRIEF DESCRIPTION OF THE FIGURES

The characteristics and the advantages of the invention will become more apparent on reading the description which follows. This description is of embodiment examples given for purposes of explanation and are non-limitative. It refers to appended drawings in which.

DETAILED DESCRIPTION OF EMBODIMENTS OF THE INVENTION

The principle of the operation of a sampler according to the invention will be described referring to FIGS. 3A to 3D.

Figure 1:
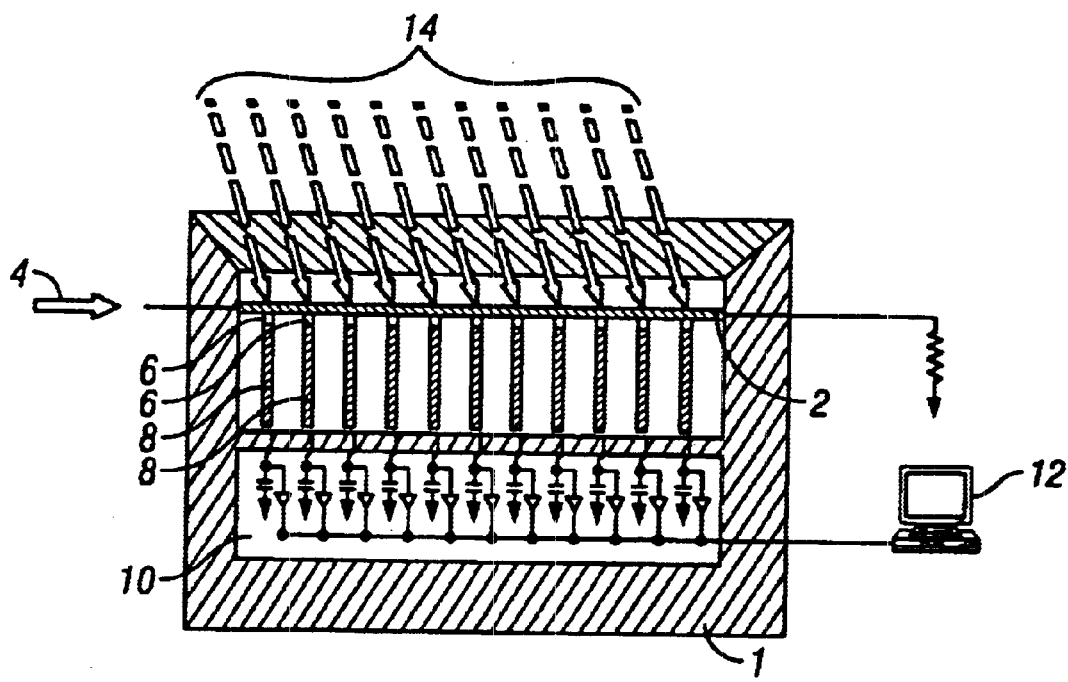
FIGS. 1 and 2 represent known samplers.
Figure 2:
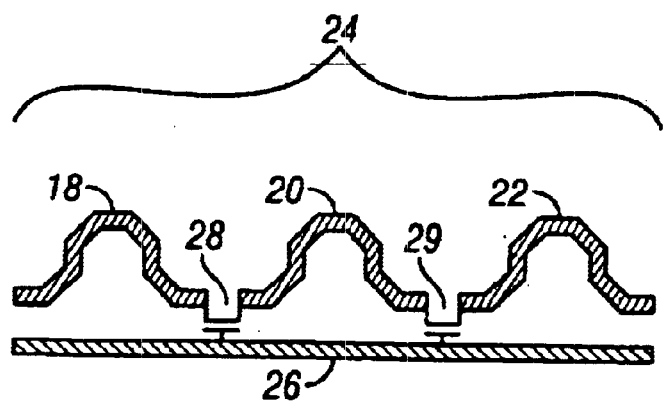
Figure 3A:
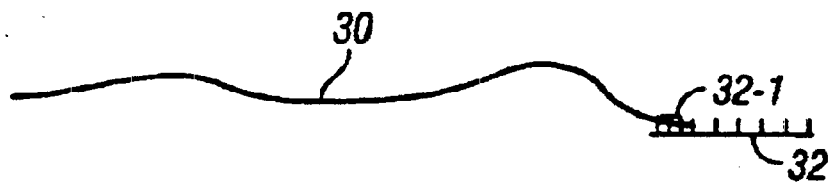
FIGS. 3A to 3D illustrate the operation of a device according to the invention.
Figure 3B:
Figure 3C:
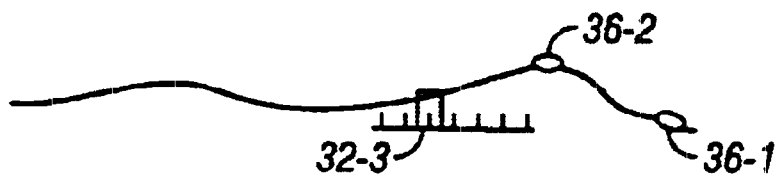
Figure 3D:
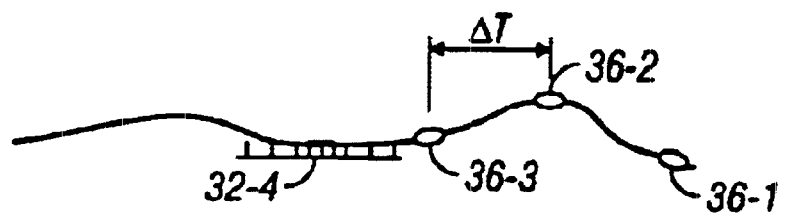

A signal 30 to be sampled will be introduced onto a line of propagation 32, which comprises N sampling means 32-1, 32-2, . . . In FIG. 3A, the start of the pulse 30 is situated opposite a sampler 32-1. The part of the signal identified by reference number 36-1 in FIG. 3B is therefore sampled. Then the signal is propagated along the line of propagation and, at a certain instant, a sampler 32-2 samples another part of the signal (the part designated by reference number 362 in FIG. 3C). The signal continues to be propagated and a sampler 32-3 samples another part 36-3 of the signal (see FIGS. 3C and 3D). Subsequently, sampler 32-4 enables one to sample yet another part of the signal (FIG. 3D).

So as to command the samplers, a sampling command signal is propagated along a line of propagation connected to the various samplers. This line of propagation is supplied by means for transmitting pulses or sampling signals. The temporal spacing AT between two sampled points on the signal (for example : 36-1 and 36-2 or 36-2 and 36-3) depends therefore on the one hand, on the speed of propagation of the signal along the propagation line and, on the other hand, on the speed of propagation of the sampling signal on the sampling line. Delay means or devices can be arranged between two successive sampling means. In this case, the delay is produced by the combination of the delay introduced by this delay device and the time of propagation of the sampling order from one sampler to a neighboring sampler.

A sampler according to the invention of the "picosecond" type allows the sampling of a voltage pulse the frequency spectrum of which extends to 20 GHz. The sampling frequency is variable depending on the phases of the pulse that is being measured, for example from 4 GHz to 20 GHz.

The voltage samples are therefore sampled by a tapping of the charge transported by the pulse to be measured.

The voltage signal is reconstituted from a certain number N of samples. One may take, for example, N=100 samples, encoded on 8 bits, and corresponding to an analysis time window of 25 ns, at 4 GHz or 5 ns at 20 GHz.

The signal to be measured is, for example, injected through a hyperfrequency co-axial connector, and a triggering signal synchronous with the pulse to be measured. The variation in the amplitude of the signal as a function of time can be available at the output, on a PC type computer, for display or for electronic data processing.

A spatial sampling device according to the invention uses as many elementary samplers as there are samples to be taken. Each elementary sampler only operates once by acquisition. The signal is propagated on a propagation support, matched to the frequencies to be analyzed, along which the samplers are to be found, arranged sequentially in such a way that the signal passes in front of each of them with a time shift linked to the spatial step of the layout of the samplers.

The acquisition order is transmitted from sampler to sampler, preferably with a controlled delay. The combination of this delay and the time of propagation of the signal on the line then determines the sampling step of the device. In this way a non-simultaneous spatial sampling is carried out.

According to one embodiment example, the line of propagation is a micro-ribbon line on sapphire, with 100 sampling points spaced at 500 μm. These points are spaced in time at 5 ps on the line (the signal passes from one point to another in 5 ps). To carry out a sampling at 20 GHz, (50 ps) a delay of 55 ps is inserted between two successive samplings, the sampling beginning through the point situated alongside the point of injection of the signal.

One then has an analysis window of 100×50 ps, or 5 ns.

The user can modify the delay to the value of 105 ps. It will then have a sampling step of 100 ps, a sampling frequency of 10 GHz, and an analysis window of 10 ns.

With a delay of 255 ps, the sampling frequency is 4 GHz and the analysis window 25 ns.

If the signal to be measured is introduced at the other end of the line, the delay between two successive samplers is 45 ps to carry out a sampling frequency of 20 GHz, 95 ps for 10 GHz and 245 ps for 4 GHz.

In general terms, one can create a sampling delay greater than 10 ps between two successive switches or samplers.

Figure 4:
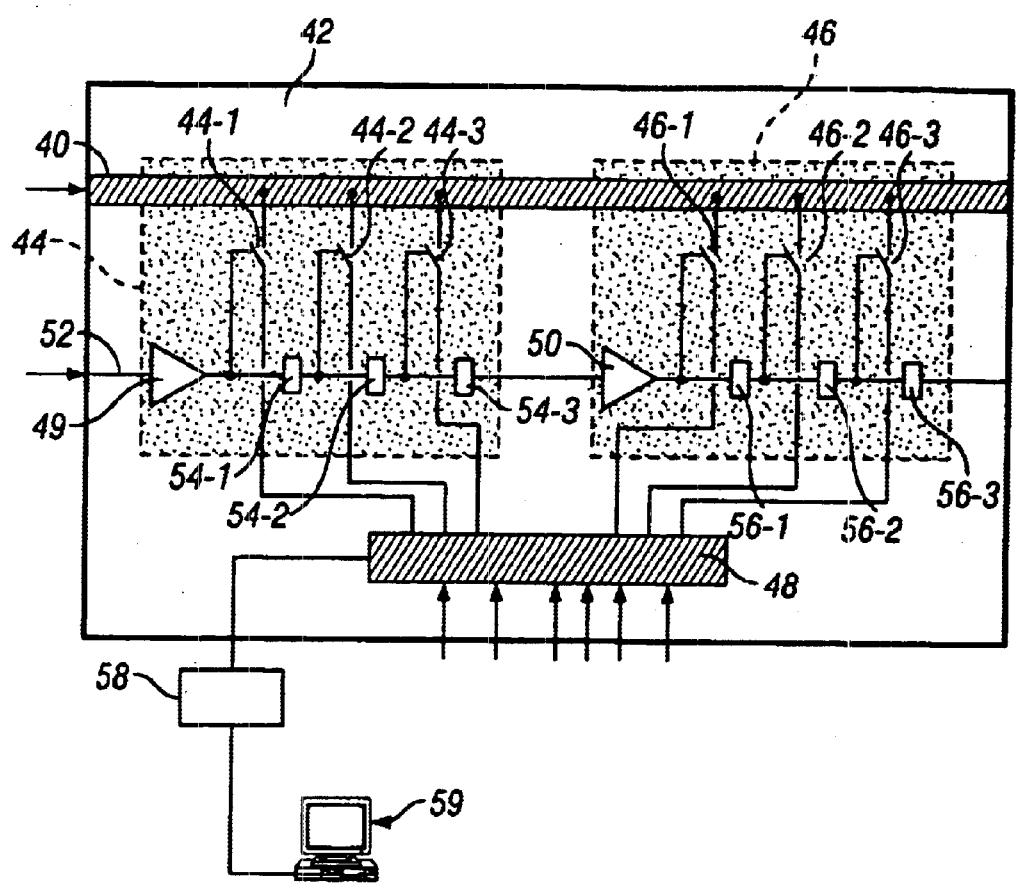
FIG. 4 represents an embodiment of a sampler according to the invention.

FIG. 4 is an embodiment example of an electrical sampler according to the invention. The sampler is produced on a ceramic 42 made of $Al_2O_3$. It comprises a micro-ribbon line 40 and an acquisition device 48 (for example: a Reticon circuit, and two modules 44, 46 made of AsGa. On the line of propagation of the sampling pulse 52, and at the input of each of the modules 44, 46, there is an amplifier 49, 50. Each module comprises three sampling devices, or switching units, 44-1, 44-2, 44-3 and 46-1, 46-2, 463. Between two neighboring switches, and on the line of propagation 52, there are means for delaying the sampling signal 54-1, 54-2, 54-3 and 56-1, 56-2, 56-3 (or delay generators). The synchronization signal allows one successively to close each of the switches and to sample a signal corresponding to the part of the pulse which is situated opposite the switch at the moment this switch is closed. A signal corresponds to the voltage part or the current part that is situated on the line of propagation 40, opposite each switch at the moment this switch is closed, and is transmitted to the acquisition system 48. This acquisition system may additionally import processing means and or means for memorizing these signals, for example digitizing means 58. This acquisition device can be connected to a micro-computer 59, for display or for electronic data processing.

According to this first embodiment of the invention, the modules 44 and 46 are connected, in a way known of itself, onto the ceramic 42. FIG. 4 is a transparent view of modules 44 and 46 through the ceramic 42.

The signal frequencies and the sampling frequencies are not the same (one may have a signal with a bandwidth equal to 10 GHz, sampled at 20 GHz). For these reasons, it is preferable to use two different substrates to create, on the one hand, the means of propagation (propagation line) of the signal and, on the other hand, the means of sampling it. The propagation and the sampling are then each carried out on the substrate which is most appropriate to it. Subsequently the two substrates are coupled through micro-connections, for example between two planes.

Figure 5:
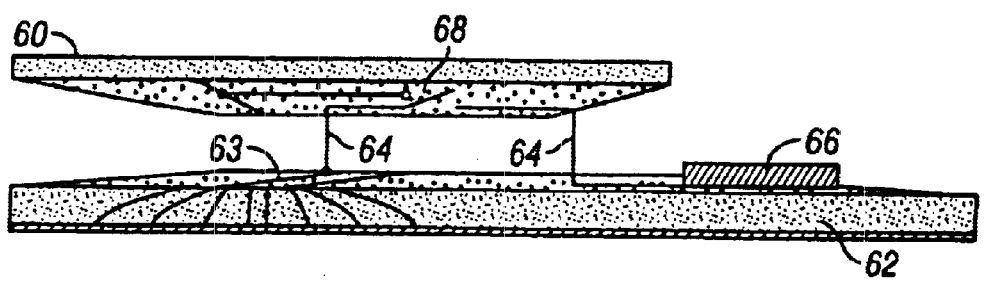
FIG. 5 represents an embodiment of a sampler according to the invention with two substrates.

This embodiment is illustrated in FIG. 5, where 62 designates a propagation support for a micro-ribbon line 63 on sapphire. Facing this support, a second semi-conductor substrate 60 carries the sampling means 68 (here, a single switch is shown). Micro-connections 64 enable one to provide the link between the two substrates. The means for storing and/or reading the information 66 can be created on the substrate 62. A signal is then retransmitted to an acquisition circuit connected onto a substrate, using micro-connections 64, after sampling. Such a device allows one to analyze a signal with a bandwidth up to 8 GHz, the samplers being able, on their side, to carry out charge integrations limited to very short periods of time (of the order of 50 ps), since they can then be created on a semi-conductor material matched to the hyperfrequency components (for example at 20 GHz).

It is possible to make a comparison of the line lengths, in the case of a simultaneous spatial sampling and in the case of a non-simultaneous spatial sampling.

If $\Delta t$ is the desired sampling time step and N is the number of sampling points, then: $F = N \times \Delta t$, where F is the breadth of the analysis window.

If V is the speed of propagation of the pulse to be measured, $l_e$ the space occupied by a sampler along the line and L is the length of the line of propagation of the pulse, then:

$L = N(V \times \Delta t + l_e)$ in the case of simultaneous sampling $L = N \times l_e$ in the case of non-simultaneous sampling.

Numerically, if one takes a breadth of window F=25 nanoseconds, a number of samplers N=100, V=100 μm/ps, $l_e$=500 μm and $\Delta t$=250 picoseconds, then L=255 cm in the case of simultaneous sampling L=5 cm in the case of non-simultaneous sampling.

With F=5 nanoseconds and $\Delta t$=50 picoseconds, one then has:

L=55 cm for simultaneous sampling

L=5 cm for non-simultaneous sampling.

Figure 6:
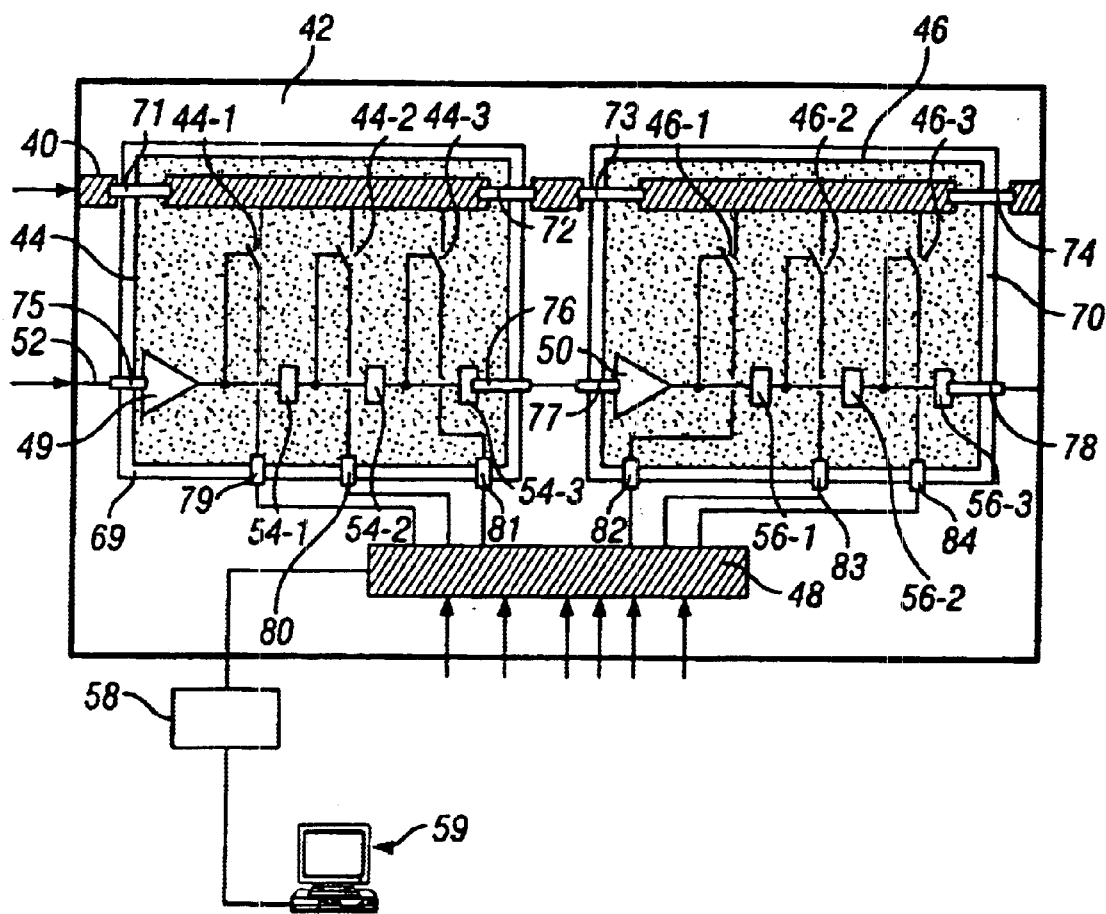
FIG. 6 represents another embodiment of a sampler according to the invention with two substrates.

FIG. 6 represents a third embodiment of a device according to the invention with two substrates. According to this embodiment, the line of propagation of the electrical pulses is alternately supported by the propagation substrate 42 and by the substrate for the modules 44 and 46 which support the samplers. It is similar for the line of propagation of the sampling pulse.

The modules 44 and 46 produced on AsGa are then either placed in hollows 69, 70 in the ceramic 42 as shown in FIG. 6, or joined onto the ceramic 42.

Connections 71, 72, 73, 74 then permit connection of the different portions of the propagation line from one substrate to the other.

According to this third embodiment of the invention, the line of propagation of the sampling pulse is also distributed over the propagation substrate 42 and over the substrate of the modules 44 and 46. Connections 75, 76, 77, 78 then permit connection of the different portions of the line of propagation of the sampling pulse from one substrate to the other.

Electrical connections 79, 80, 81 allow connection of the respective switches 44-1, 44-2, 44-3 to the acquisition system 48. Similarly, electrical connections 82, 83, 84 permit connection of the respective switches 46-1, 46-2, 46-3 to the acquisition system 48.

According to this third embodiment of the invention, the local geometry of the line of propagation of the electrical pulses can advantageously be designed to take into account in a very precise way, the input impedances of the samplers.

What is claimed is:

1. Electrical sampler, characterized in that it comprises:
    a propagation structure for electrical pulses;
    a propagation line for sampling signals;
    N distinct means of sampling connected, on the one hand, to sampling points along the propagation structure and, on the other hand, to the propagation line for sampling signals;
    means to temporally delay the propagation of said sampling signal between two neighboring means of sampling; and
    amplification means distributed in series along the line of propagation.

2. Sampler according to claim 1, additionally comprising means to vary the delay between two successive sampling means.

3. Sampler according to claim 2, the propagation structure being a micro-ribbon line or coplanar line.

4. Sampler according to claim 1, the propagation structure being a micro-ribbon line or coplanar line.

5. Sampler according to claim 1:
    the structure for the propagation of electrical pulses being created on a first substrate, and
    the line for the propagation of sampling signals being created on a second substrate.

6. Sampler according to claim 5, the two substrates being connected by micro-connections.

7. Sampler according to claim 5, sampling means also being created on the second substrate.

8. Sampler according to claim 5, the structure for the propagation of electrical pulses and the means for the propagation of sampling signals being alternately created on a first substrate and on a second substrate, first connections permitting connection of the different portions of the propagation structure between the first substrate and the second substrate and second connections permitting connection of the different portions of the means of propagating sampling signals between the first substrate and the second substrate.

9. Sampler according to claim 1, the time delay between two consecutive sampling means being greater than 10 picoseconds.

10. An electrical sampler, characterized in that it comprises:
    a plurality of means of sampling an electrical signal, each of the means of sampling responsive to a corresponding sampling point;
    a propagation line coupled to each of the plurality of means of sampling, for propagating a sampling signal;
    delay means, coupled to the propagation line, to delay the propagation of said sampling signal between two neighboring means of sampling;
    amplification means distributed in series along the line of propagation.

11. An electric sampling system, comprising:
    a plurality of first circuitries for sampling an electrical signal, each of the first circuitries responsive to an electrical condition at a corresponding sampling point;
    a propagation line, coupled to each of the plurality of first circuitries, for propagating a sampling signal;
    a plurality of amplifiers coupled to the propogation line and distributed in series along the propogation line;
    a second circuitry, coupled to the propagation line, to enable non-simultaneous sampling of any two of the first circuitries.

12. An electric sampling system, comprising:
    a plurality of first circuitries for sampling an electrical signal, each of the first circuitries responsive to an electrical condition at a corresponding sampling point;
    a propagation line, coupled to each of the plurality of first circuitries, for propagating a sampling signal;
    a plurality of second circuitries, coupled to the propagation line, to enable non-simultaneous sampling, at any neighboring two of the plurality of first circuitries in succession;
    a plurality of third circuitries, coupled in series with one another along the propagation line, to enable amplification of the sampling signal.

* * * * *